United States Patent [19]

Hedberg

[11] Patent Number: 4,890,301
[45] Date of Patent: Dec. 26, 1989

[54] ARRANGEMENT FOR COMPENSATING ERRORS IN A QUADRATURE MODULATOR

[75] Inventor: Bo G. Hedberg, Vällingby, Sweden

[73] Assignee: Telefonaktiebolaget L M Ericsson, Stockholm, Sweden

[21] Appl. No.: 270,259

[22] Filed: Nov. 14, 1988

[30] Foreign Application Priority Data

Nov. 27, 1987 [SE] Sweden .............................. 8704741

[51] Int. Cl.⁴ .............................................. H03C 1/02
[52] U.S. Cl. .................................... 375/60; 332/123; 455/103
[58] Field of Search ...................... 375/60, 61, 39, 58, 375/57; 455/103, 109, 119, 47, 126; 332/18, 37 R, 37 D; 330/149

[56] References Cited

U.S. PATENT DOCUMENTS

| | | | |
|---|---|---|---|
| 3,141,134 | 7/1964 | Osborne et al. | 455/109 |
| 3,906,401 | 9/1975 | Seidel | 332/18 |
| 4,462,001 | 7/1984 | Girard | 330/149 |
| 4,724,405 | 2/1988 | Matthies et al. | 332/31 T |
| 4,801,899 | 1/1989 | Ashida | 332/17 |

Primary Examiner—Benedict V. Safourek
Assistant Examiner—Tesfaldet Bocure
Attorney, Agent, or Firm—Burns, Doane, Swecker & Mathis

[57] ABSTRACT

An arrangement for compensating errors occurent in a quadrature modulator. Two quadrature signals (cos a(t), sin a(t)) in the baseband are generated, each of which signals is delivered to a respective branch in the modulator two high frequency signals (cos wt, sin wt) with a mutual phase difference of 90 degrees are generated and mixed with the quadrature signals (cos a(t), sin a(t)) and an adder (5) produces the sum of the output signals of the mixers (3, 4). Amplitude errors and phase errors are compensated with the aid of a separate compensating network (11, 12, 14, 16, 17, 19, 21) which is incorporated in the low frequency part of the modulator and which includes adjustable signal generator (14, 16). Local oscillator leakage is compensated with the aid of a second compensating network (13, 15, 18, 20) which is also incorporated in the low frequency part of the modulator and which also includes an adjustable signal generator (15, 18). The signals (k4, k5) from the latter generator (15, 18) are subtracted from the signals occuring in the two branches of the modulator.

2 Claims, 1 Drawing Sheet

ARRANGEMENT FOR COMPENSATING ERRORS IN A QUADRATURE MODULATOR

TECHNICAL FIELD

The present invention relates to an arrangement for error compensation in a quadrature modulator of the kind which includes means for generating in the baseband two quadrature signals, each of which is applied to its respective branch in the modulator, means for generating two high frequency signals with a mutual phase difference of 90 degrees, a mixer for mixing the quadrature signals with the high frequency signals, and an adder for producing the sum of the mixer output signals. The errors concerned are errors in amplitude, phase errors, and error caused by local oscillator leakages.

BACKGROUND ART

In the case of a quadrature modulator of the aforesaid kind errors in amplitude and errors in phase can occur, for instance, in the high-frequency signal generating means, in the mixers and in the adder. Phase errors may also occur as a result of different wave lengths on, for instance, pattern cards in the modulator. In order to achieve the result desired, the amplitude error and phase error in the modulator should not exceed about ½ dB and about 3 degress respectively. It is difficult, however, to achieve such low values for frequencies which are higher than some 100 MHz. For example, the wave length at 1000 MHz is about 3 dm, which means that one (1) degree will correspond to a distance in the order of one (1) mm.

Local oscillator leakages occur as result of the leakage of signals through the mixers from the high frequency signal generating means. Leakage signals can result in so-called widening of the spectrum range, particularly when using non-linear transmission terminal stages, which in turn can result in disturbances in neighbouring traffic channels. It is known to attempt to counteract the occurence of amplitude and phase errors and local oscillator leakages, by using components which have relatively good properties, although costs then become comparatively high.

DISCLOSURE OF INVENTION

The object of the present invention is to provide an arrangement which will avoid problems arising from amplitude and phase errors and local oscillator leakages in a quadrature modulator of the aforesaid kind. This object is achieved by incorporating in the low frequency part of the modulator a separate compensating network which includes adjustable signal generating means.

The characteristic features of the invention are set forth in the following claims.

BRIEF DESCRIPTION OF DRAWING

The invention will now be described in more detail with reference to the accompanying drawing, in which.

BEST MODE FOR CARRYING OUT THE INVENTION

Figure 1:
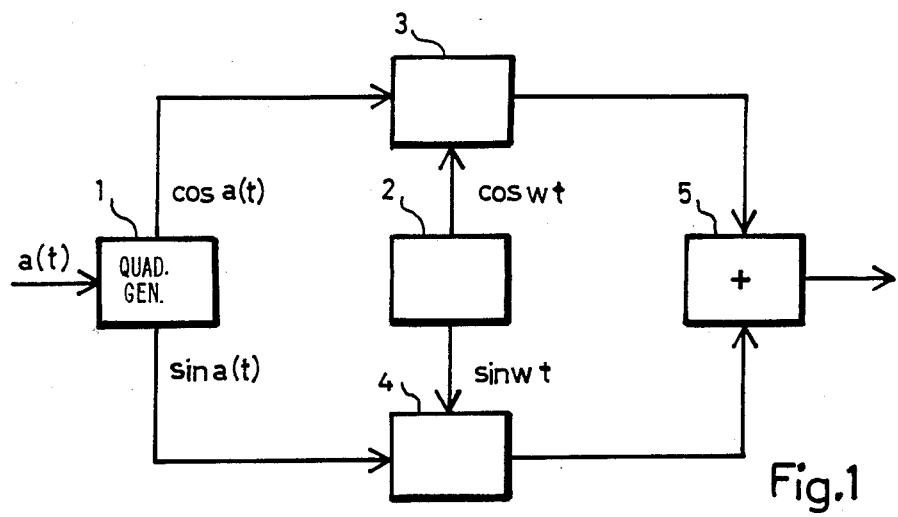
FIG. 1 illustrates a known quadrature modulator and
FIG. 2 illustrates a quadrature modulator which is equipped with an arrangement constructed in accordance with the invention.

FIG. 1 illustrates a known quadrature modulator. The reference sign 1 identifies a means for generating two quadrature signals in the baseband, these signals being designated cos a(t) and sin a(t) respectively. The reference sign 2 identifies a means for generating two high frequency signals, cos wt and sin wt respectively, which are of the same frequency but have a mutual phase difference of 90 degrees. Each of these signals is delivered to a respective mixer 3, 4, in which said signals are mixed with the quadrature signals in the baseband. The mixer output signals are delivered to an adder 5, the output of which produces signals cos wt×cos a(t)+sin wt×sin a(t). This signal can also be designated cos (wt−a(t)).

However, in practice the signal from the adder will be influenced by amplitude error, phase error and oscillator leakage, and can therefore instead be designated cos wt×cos a(t)+A×sin (wt+V)×sin a(t)+L×cos (wt+U). In this expression, A represents the amplitude error, V the phase error and L×cos (wt+U) the oscillator leakage, the error conceivably only occuring in one branch, the lower branch, of the modulator.

Figure 2:
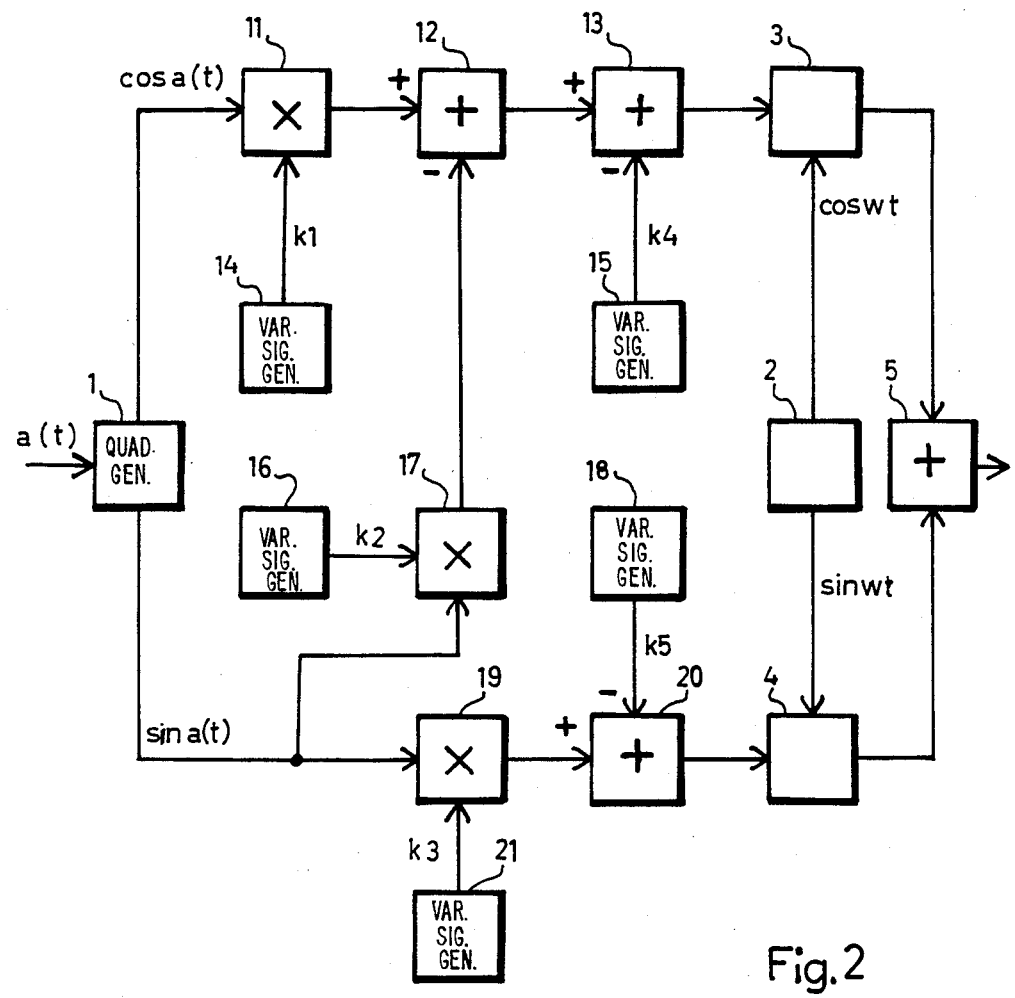

FIG. 2 illustrates a quadrature modulator which includes an arrangement constructed in accordance with the invention. Means which have correspondence in FIG. 1 have been identified with the reference signs previously used therefor. The reference signs 14, 16 and 21 identify adjustable signal generating means which are operative in generating signals designated k1, k2 and k3. The quadrature signal cos a(t) is multiplied by the signal k1 in a multiplier 11, and the quadrature signal sin a(t) is multiplied by the signal k2 in a multiplier 17. The output signal from the multiplier 17 is subtracted from the output signal from the multiplier 11 in a subtractor 12. A signal k4 generated in an adjustable signal generating means 15 is subtracted in a subtractor 13 from the output signal from the subtractor 12. The signal formed is thus k1×cos a(t)−k2×sin a(t)−k4.

The quadrature signal sin a(t) is also delivered to a multiplier 19 in which it is multiplied by a signal k3 from an adjustable signal generating means 21. A signal k5 generated in an adjustable signal generating means 18 is subtracted from the output signal of the multiplier 19 in a subtraction circuit 20. The signal k3×sin a(t)−k5 is formed in the subtraction circuit 20.

The signal (k1×cos a(t)−k2×sin a(t)−k4)×cos wt+(K3×sin a(t)−k5)×A×sin (wt+V)+L×cos (wt+U) is obtained on the output of the adder 5. Similar to the case aforesaid, A is the amplitude error, V is the phase error and L×cos (wt+U) is the oscillator leakage. When extended, this expression becomes k1×cos a(t)×cos wt−k2×sin a(t)×cos wt−k4×cos wt+A×k3×sin a(t)×sin wt×cos V+A×k3×sin a(t)×cos wt×sin V−A×k5×sin wt×cos V−A×k5×cos wt×sin V+L×cos wt×cos U−L×sin wt×sin U. Two equations which include k4, k5 and L can be compiled from the above expression.

$$-k4 \times \cos wt - A \times k5 \times \cos wt \times \sin V + L \times \cos wt \times \cos U = 0 \qquad (1)$$

$$-A \times k5 \times \sin wt \times \cos V - L \times \sin wt \times \sin U = 0 \qquad (2)$$

Values for k4 and k5 can be determined from these equations and used to compensate for oscillator leakage. From equation (2) there is obtained $$k5 = -L \times \sin U / (A \times \cos V).$$

If this expression is inserted in equation (1), $k4 = L \times (\cos U + \sin U \times \sin V / \cos V)$ will be obtained.

If the above expressions containing k4, k5 and L are eliminated from the expression which respresents the signal on the output of the adder 5, the expression $k1 \times \cos a(t) \times \cos wt - k2 \times \sin a(t) \times \cos wt + A \times k3 \times \sin a(t) \times \sin wt \times \cos V + A \times k3 \times \sin a(t) \times \cos wt \times \sin V$ will remain. If k1 is made equal to cos V, k2 is made equal to V and k3 is made equal to 1/A, the second and fourth terms cancel out each other. Therre then remains $\cos V \times \cos a(t) \times \cos wt + \sin a(t) \times \sin wt \times \cos V = \cos V \times (\cos wt \times \cos a(t) + \sin wt \times \sin a(t)) = \cos V \times \cos(wt - a(t))$. With the exception of cos V this expression is equal to the ideal expression derived in connection with the FIG. 1 embodiment without taking into account amplitude error, phase error and local oscillator leakages. Since V represents the phase error and this error can be assumed to have a small value, the value of cos V in practive will be slightly less than one (1).

When using an arrangement constructed in accordance with the invention, with suitably adjusted values of the signals k1–k5, the residual error in the output signal of the modulator will consist solely of a constant amplitude factor which is slight smaller than one. This factor has no significance in practive, however.

Thus, the inventive arrangement comprises a compensatory network which includes adjustable signal generating means and which is incorporated in the low frequency part of the modulator. This compensating network, however, can be said to consist of two separate networks, of which one compensates for amplitude and phase errors and the other compensates for local oscillator leakages. The networks are thus capable of functioning independently of one another.

According to one practical embodiment, the compensating network may comprise operational amplifiers and trimmable resistors. Adjustment of the signals k1–k3 can be effected in the following manner. When a(t) is chosen as $(w_m \times t)$, the ideal output signal of the modulator will be $\cos(w \times t - w_m \times t)$, i.e. it will include solely the frequency $w - w_m$. In practice, however, a further frequency component is formed as a result of errors in phase and amplitude. This further frequency component can be caused to disappear with the aid of a spectrum analyser and by changing the signals k1–k3 iteratively. Correspondingly, an undesired frequency component caused by local oscillator leakage can be caused to disappear, by changing iteratively the signals k4 and k5.

I claim:

1. An arrangement for compensating errors occurrent in a quadrature modulator which includes means (1) for generating two quadrature signals in the baseband, cos a(t) and sin a(t), to a first and a second branch respectively in the modulator; means (2) for generating two high frequency signals (cos wt, sin wt) with a mutual phase difference of 90 degrees; mixers (3,4) for mixing the quadrature signals, with the high frequency signals (cos wt, sin wt) and an adder (5) for producing the sum of the output signals of said mixers (3,4), characterized in that the arrangement further includes adjustable signal generating means (14, 16, 21) for generating a first (k1), a second (k2) and a third (k3) signal; a means (11) incorporated in said first branch of the modulator for forming a fourth signal which constitutes the product of the cos a(t) quadrature signal and said first signal (k1); a means (17) for forming a fifth signal which constitutes the product of the sin a(t) quadrature signal and said second signal (k2); a means (12) incorporated in said first branch for forming a sixth signal which constitutes the difference between said fourth signal and said fifth signal; and a means (19) incorporated in said second branch of the modulator for forming a seventh signal which constitutes the product of the sin a(t) quadrature signal and said third signal (k3), whereby amplitude error and phase error are compensated by suitably adjusted values of said first to third signals (k1–k3).

2. An arrangement according to claim 1, characterized in that the arrangement further includes adjustable signal generating means (15, 18) for generating an eighth (k4) and a ninth (k5) signal; a means (13) incorporated in said first branch of the modulator for forming a signal which constitutes the difference between said sixth and eighth signals; and a means (20) incorporated in said second branch of the modulator for forming a signal which constitutes the difference between said seventh and ninth signal, whereby local oscillator leakage is also compensated with the aid of suitably adjusted values of said eighth (k4) and ninth (k5) signals.

* * * * *